United States Patent
Kim et al.

(10) Patent No.: US 11,962,311 B2
(45) Date of Patent: Apr. 16, 2024

(54) SUB-SAMPLING PHASE LOCKED LOOP WITH COMPENSATED LOOP BANDWIDTH AND INTEGRATED CIRCUIT INCLUDING THE SAME

(71) Applicant: Samsung Electronics Co., Ltd., Suwon-si (KR)

(72) Inventors: Gyusik Kim, Suwon-si (KR); Seungjin Kim, Yongin-si (KR); Seunghyun Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/865,811

(22) Filed: Jul. 15, 2022

(65) Prior Publication Data
US 2023/0122691 A1    Apr. 20, 2023

(30) Foreign Application Priority Data

Oct. 20, 2021    (KR) .................... 10-2021-0139933
Dec. 13, 2021    (KR) .................... 10-2021-0177631

(51) Int. Cl.
     *H03L 7/091*      (2006.01)
     *H03L 7/099*      (2006.01)

(52) U.S. Cl.
     CPC .............. *H03L 7/091* (2013.01); *H03L 7/099* (2013.01)

(58) Field of Classification Search
     CPC .......... H03L 7/085; H03L 7/091; H03L 7/093
     See application file for complete search history.

(56) References Cited

U.S. PATENT DOCUMENTS

| | | | |
|---|---|---|---|
| 6,727,768 B1 * | 4/2004 | Dasgupta | H03K 3/0231 |
| | | | 331/177 R |
| 7,345,550 B2 | 3/2008 | Bellaouar et al. | |
| 7,583,166 B2 | 9/2009 | Lin et al. | |

(Continued)

FOREIGN PATENT DOCUMENTS

| | | |
|---|---|---|
| EP | 0642227 A1 | 3/1995 |
| KR | 10-2021-0009924 A | 1/2021 |
| WO | WO-2018/140263 A1 | 8/2018 |

OTHER PUBLICATIONS

Extended European Search Report dated Mar. 20, 2023 for corresponding European Application No. 22200914.4.

*Primary Examiner* — Diana J. Cheng
(74) *Attorney, Agent, or Firm* — Harness, Dickey & Pierce, P.L.C.

(57) ABSTRACT

A sub-sampling phase locked loop includes a slope generating and sampling circuit, first and second transconductance circuits, a constant transconductance bias circuit, a loop filter and a voltage controlled oscillator. The slope generating and sampling circuit generates a sampling voltage based on a reference clock signal and an output clock signal. The first and second transconductance circuits generate first and second output control voltages based on the sampling voltage, a reference voltage and a control current. The constant transconductance bias circuit includes a switched capacitor resistor. The constant transconductance bias circuit is configured to generate the control current. The loop filter is connected to output terminals of the first and second transconductance circuits. The voltage controlled oscillator generates the output clock signal based on the first and second output control voltages.

19 Claims, 13 Drawing Sheets

(56) References Cited

U.S. PATENT DOCUMENTS

| | | |
|---|---|---|
| 8,125,254 B1 | 2/2012 | Ding |
| 8,170,169 B2 | 5/2012 | Martin et al. |
| 8,503,597 B2 | 8/2013 | Fischette et al. |
| 8,547,149 B2 | 10/2013 | An et al. |
| 8,570,079 B2 | 10/2013 | Ferriss et al. |
| 8,810,323 B2 | 8/2014 | Ardehali |
| 9,991,897 B1 | 6/2018 | Park et al. |
| 10,277,389 B2 | 4/2019 | Terlemez et al. |
| 10,359,794 B2 * | 7/2019 | Ates .................. G05F 3/24 |
| 10,879,914 B1 | 12/2020 | Jung et al. |
| 10,897,259 B1 * | 1/2021 | Kim .................. H03L 7/093 |
| 10,972,109 B2 | 4/2021 | Kundu et al. |
| 11,057,040 B2 | 7/2021 | Jung et al. |
| 2015/0177772 A1 | 6/2015 | Casagrande et al. |
| 2019/0214976 A1 | 7/2019 | Wu et al. |
| 2021/0344306 A1 * | 11/2021 | Rothe .................. H03F 3/45475 |

* cited by examiner

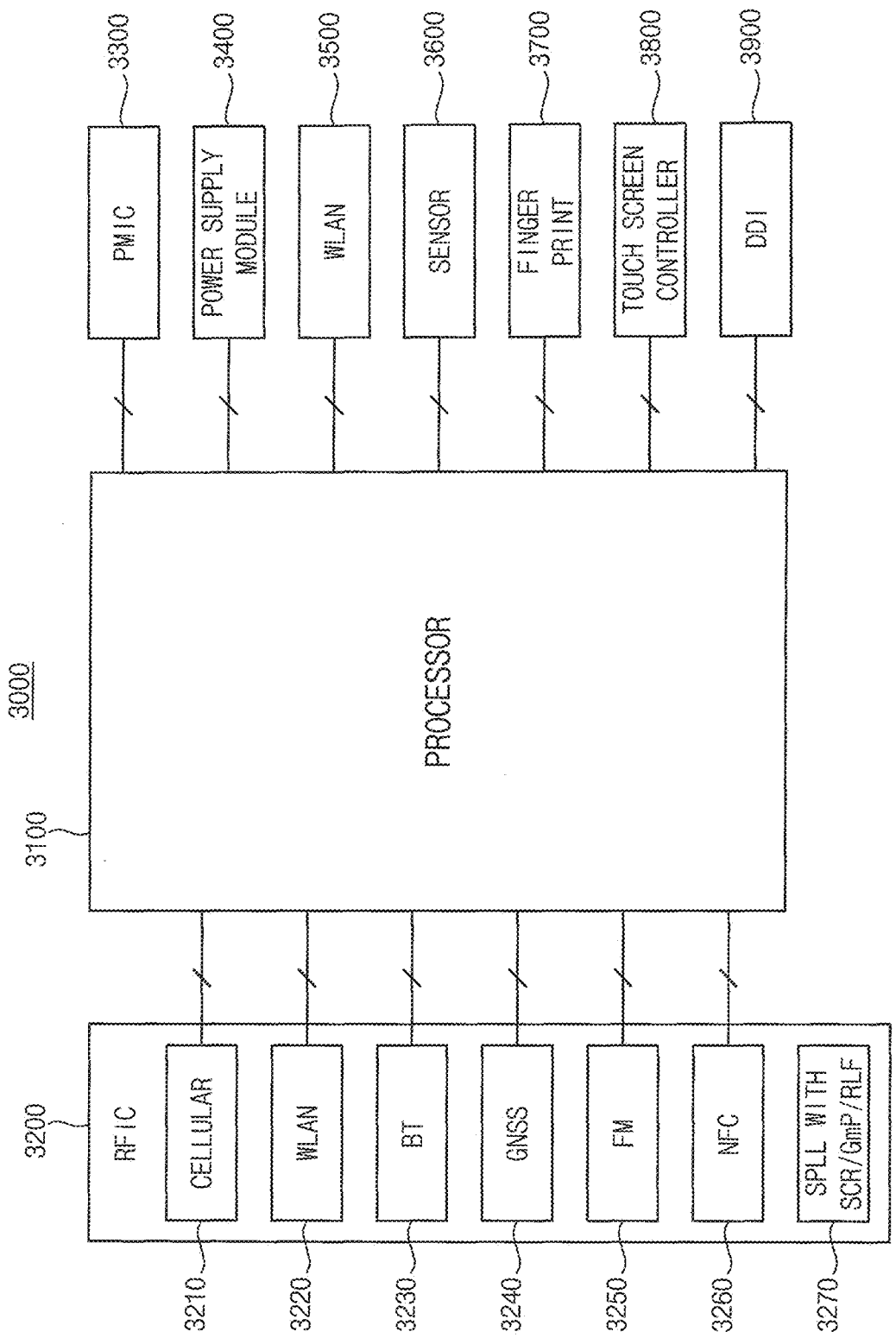

SUB-SAMPLING PHASE LOCKED LOOP WITH COMPENSATED LOOP BANDWIDTH AND INTEGRATED CIRCUIT INCLUDING THE SAME

CROSS-REFERENCE TO RELATED APPLICATIONS

This application claims priority under 35 USC § 119 to Korean Patent Application No. 10-2021-0139933 filed on Oct. 20, 2021 and to Korean Patent Application No. 10-2021-0177631 filed on Dec. 13, 2021 in the Korean Intellectual Property Office (KIPO), the contents of each of which are herein incorporated by reference in their entirety.

BACKGROUND

1. Technical Field

Example embodiments relate generally to semiconductor integrated circuits, and more particularly to sub-sampling phase locked loops (PLLs) with compensated loop bandwidth and/or integrated circuits including the sub-sampling phase locked loops.

2. Description of the Related Art

In spite of improvements of speed and data transmission rates of peripheral devices (such as memory, communication devices, or graphic devices), operating speeds of peripheral devices have not kept up with operating speeds of processors, in some cases. Further, there is often a speed difference between new microprocessors and their peripheral devices. Thus, some high performance digital systems have been required or desired to dramatically improve speed of peripheral devices.

For example, a load of a bus increases and a transmission frequency becomes faster in an input and output method of transmitting data by synchronizing a clock signal for a data transmission between a memory device and a memory controller.

SUMMARY

At least one example embodiment of the present disclosure provides a sub-sampling phase locked loop (PLL) with loop bandwidth compensated for influences of process, voltage, and temperature (PVT) variations.

At least one example embodiment of the present disclosure provides an integrated circuit including the sub-sampling phase locked loop.

According to some example embodiments, a sub-sampling phase locked loop (PLL) includes a slope generating and sampling circuit, a first transconductance circuit, a second transconductance circuit, a constant transconductance bias circuit, a loop filter and a voltage controlled oscillator (VCO). The slope generating and sampling circuit generates a sampling voltage based on a reference clock signal and an output clock signal. The first transconductance circuit generates a first output control voltage based on the sampling voltage, a reference voltage and a control current. The second transconductance circuit generates a second output control voltage based on the sampling voltage, the reference voltage and the control current. The constant transconductance bias circuit includes a switched capacitor resistor (SCR). The constant transconductance bias circuit is configured to generate the control current. The loop filter is connected to an output terminal of the first transconductance circuit and an output terminal of the second transconductance circuit. The voltage controlled oscillator generates the output clock signal based on the first output control voltage and the second output control voltage.

According to some example embodiments, an integrated circuit includes a sub-sampling phase locked loop (PLL) and an internal circuit. The sub-sampling phase locked loop generates an output clock signal based on a reference clock signal. The internal circuit operates based on the output clock signal. The sub-sampling phase locked loop includes a slope generating and sampling circuit, a first transconductance circuit, a second transconductance circuit, a constant transconductance bias circuit, a loop filter and a voltage controlled oscillator (VCO). The slope generating and sampling circuit generates a sampling voltage based on the reference clock signal and the output clock signal. The first transconductance circuit generates a first output control voltage based on the sampling voltage, a reference voltage and a control current. The second transconductance circuit generates a second output control voltage based on the sampling voltage, the reference voltage and the control current. The constant transconductance bias circuit includes a switched capacitor resistor (SCR). The constant transconductance bias circuit is configured to generate the control current. The loop filter is connected to an output terminal of the first transconductance circuit and an output terminal of the second transconductance circuit. The voltage controlled oscillator generates the output clock signal based on the first output control voltage and the second output control voltage.

According to some example embodiments, a sub-sampling phase locked loop (PLL) includes a slope generating and sampling circuit, a constant transconductance bias circuit, a first transconductance circuit, a second transconductance circuit, a loop filter and a voltage controlled oscillator (VCO). The slope generating and sampling circuit includes a first resistor and a first capacitor. The slope generating and sampling circuit is configured to generate a sampling voltage based on a reference clock signal and an output clock signal. A slope of the sampling voltage is inversely proportional to a resistance of the first resistor and a capacitance of the first capacitor. The constant transconductance bias circuit includes a switched capacitor resistor (SCR) including a second capacitor. The constant transconductance bias circuit is configured to generate the control current. A current level of the control current is proportional to a capacitance of the second capacitor. The first transconductance circuit generates a first output control voltage based on the sampling voltage, a reference voltage and a control current. A voltage level of the first output control voltage is proportional to a resistance of a second resistor and the capacitance of the second capacitor. The second transconductance circuit generates a second output control voltage based on the sampling voltage, the reference voltage and the control current. The loop filter includes the second resistor. The loop filter is connected to an output terminal of the first transconductance circuit and an output terminal of the second transconductance circuit. The voltage controlled oscillator generates the output clock signal based on the first output control voltage and the second output control voltage. A proportional path of the sub-sampling phase locked loop is formed by the first transconductance circuit, and an integral path of the sub-sampling phase locked loop is formed by the second transconductance circuit. A loop bandwidth of the sub-sampling phase locked loop is regardless of the resistance of the first resistor, the capacitance of the first capacitor, the resistance of the second resistor and the capacitance of the second capacitor. The loop bandwidth of the sub-sampling phase locked loop is proportional to a gain of the proportional path.

In the sub-sampling phase locked loop and the integrated circuit according to some example embodiments, the constant transconductance bias circuit may include the switched capacitor resistor, the first transconductance circuit and the second transconductance circuit may be disposed on the proportional path and the integral path, respectively, and the loop filter may include the resistor connected to the output terminal of the first transconductance circuit. The influence of the distributions of the resistors and the capacitors included in the slope generating and sampling circuit on the loop bandwidth may be canceled by the capacitor included in the switched capacitor resistor and the resistor included in the loop filter. Accordingly, the sub-sampling phase locked loop may have the loop bandwidth in which the influence of process, voltage, and temperature (PVT) variation is compensated (e.g., the loop bandwidth relatively insensitive to the PVT variation), and may have improved and/or enhanced performance.

BRIEF DESCRIPTION OF THE DRAWINGS

Illustrative, non-limiting example embodiments will be more clearly understood from the following detailed description taken in conjunction with the accompanying drawings.

FIG. 12 is a block diagram illustrating a digital processing system according to some example embodiments.

DETAILED DESCRIPTION OF THE EMBODIMENTS

Figure 1:
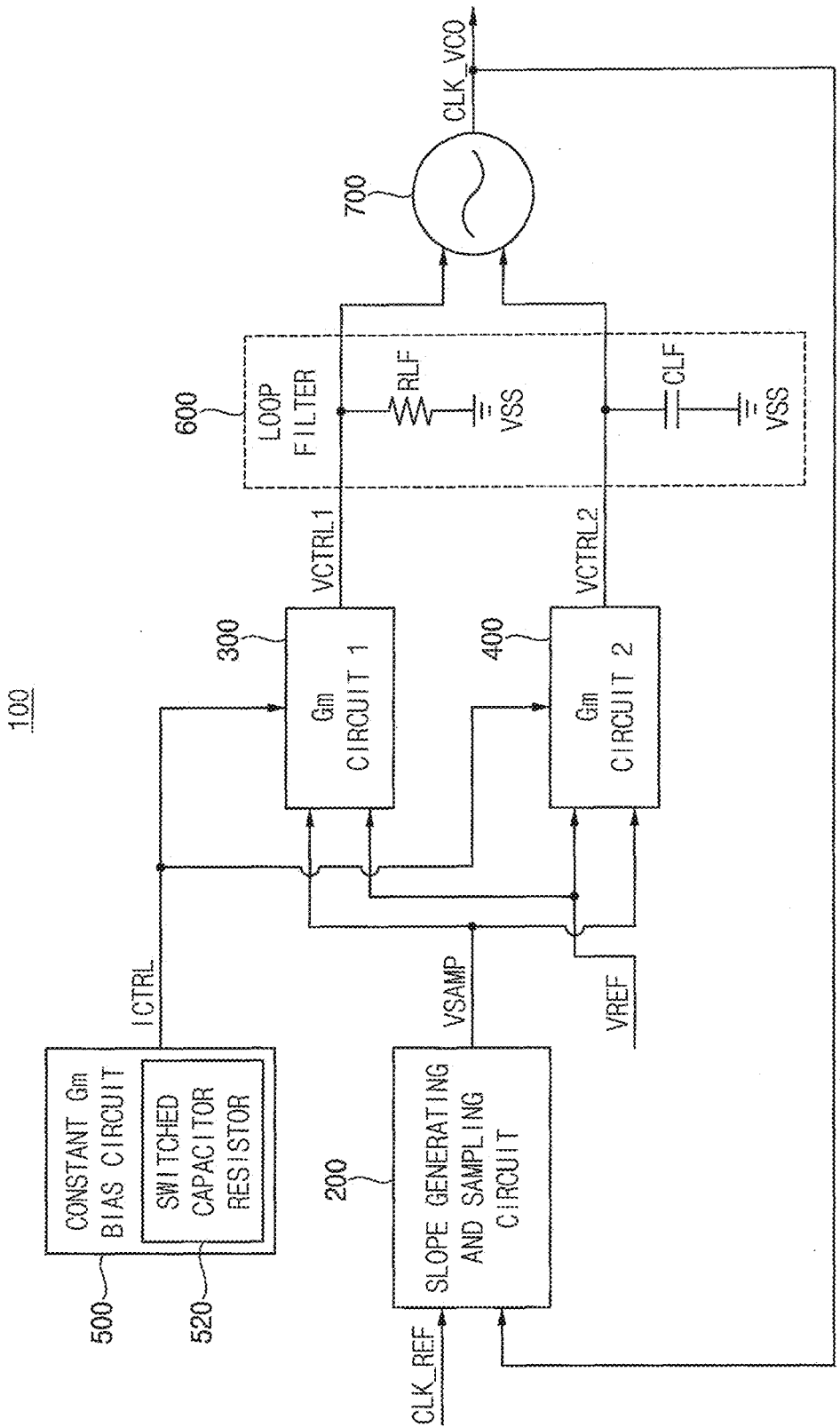
FIG. 1 is a block diagram illustrating a sub-sampling phase locked loop according to some example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a sub-sampling phase locked loop according to some example embodiments.

Referring to FIG. 1, a sub-sampling phase locked loop (PLL) 100 includes a slope generating and sampling circuit 200, a first transconductance (Gm) circuit 300, a second transconductance circuit 400, a constant transconductance bias circuit 500, a loop filter 600 and a voltage controlled oscillator (VCO) 700.

The slope generating and sampling circuit 200 generates a sampling voltage VSAMP based on a reference clock signal CLK_REF and an output clock signal CLK_VCO. The reference clock signal CLK_REF and the output clock signal CLK_VCO may correspond to an input and an output of the sub-sampling phase locked loop 100, respectively. For example, the reference clock signal CLK_REF may be generated, e.g., by a crystal oscillator that uses a crystal material, and may have a fixed frequency. Thus, a frequency of the reference clock signal CLK_REF may be used as a reference frequency (e.g., a target frequency) for a frequency of the output clock signal CLK_VCO.

The sampling voltage VSAMP may correspond to a phase error between the reference clock signal CLK_REF and the output clock signal CLK_VCO. The slope generating and sampling circuit 200 may generate the sampling voltage VSAMP representing the phase error based on sampling operations. The slope generating and sampling circuit 200 may be referred to as a sampling-based phase detector (PD) or a sampling-based phase frequency detector (PFD).

In some example embodiments, as will be described with reference to FIGS. 3A, 3B and 3C, the sampling voltage VSAMP may have a first voltage level that is a relatively low voltage level or a second voltage level that is a relatively high voltage level. For example, when a phase of the reference clock signal CLK_REF leads a phase of the output clock signal CLK_VCO, e.g., when the phase of the output clock signal CLK_VCO lags behind the phase of the reference clock signal CLK_REF, the sampling voltage VSAMP having the first voltage level may be generated. When the phase of the reference clock signal CLK_REF lags behind the phase of the output clock signal CLK_VCO, e.g., when the phase of the output clock signal CLK_VCO leads the phase of the reference clock signal CLK_REF, the sampling voltage VSAMP having the second voltage level may be generated.

Detailed configurations and operations of the slope generating and sampling circuit 200 will be described with reference to FIGS. 2, 3A, 3B, 3C and 3D.

The constant transconductance bias circuit 500 generates a control current ICTRL and provides the control current ICTRL to the first transconductance circuit 300 and the second transconductance circuit 400. The control current ICTRL may be used to operate or drive the first transconductance circuit 300 and the second transconductance circuit 400.

The constant transconductance bias circuit 500 includes a switched capacitor resistor (SCR) 520. For example, as will be described with reference to FIG. 4, the switched capacitor resistor 520 may include at least one capacitor and at least one switch.

A switched capacitor resistor is a type of switched capacitor (SC) and is the simplest switched capacitor. A switched capacitor is an electronic circuit element implementing a filter, and works by moving charges into and out of capacitors when switches are opened and closed. Usually, non-overlapping signals are used to control the switches, so that not all switches are closed simultaneously. Filters implemented with these elements are termed "switched-capacitor filters", and depend only on the ratios between capacitances. This makes them much more suitable for use within integrated circuits, where accurately specified resistors and capacitors are not economical to construct.

Detailed configurations and operations of the constant transconductance bias circuit 500 will be described with reference to FIGS. 4, 5A, 5B and 5C.

The first transconductance circuit 300 generates a first output control voltage VCTRL1 based on the sampling voltage VSAMP, a reference voltage VREF and the control current ICTRL. The second transconductance circuit 400 generates a second output control voltage VCTRL2 based on the sampling voltage VSAMP, the reference voltage VREF and the control current ICTRL. For example, a proportional path of the sub-sampling phase locked loop 100 may be formed by the first transconductance circuit 300, and an integral path of the sub-sampling phase locked loop 100 may be formed by the second transconductance circuit 400.

The loop filter 600 is connected to an output terminal of the first transconductance circuit 300 and an output terminal of the second transconductance circuit 400. The loop filter 600 may include a resistor RLF and a capacitor CLF. The resistor RLF may be connected between the output terminal of the first transconductance circuit 300 and a ground voltage VSS. The capacitor CLF may be connected between the output terminal of the second transconductance circuit 400 and the ground voltage VSS. The loop filter 600 may have a structure in which the resistor RLF and the capacitor CLF are electrically and/or physically separated from each other. In some example embodiments, the loop filter 600 may eliminate the jitter by removing the glitch and by preventing the voltage overshoot.

The constant transconductance bias circuit 500, the first transconductance circuit 300 and the second transconductance circuit 400 may form a charge pump. For example, the charge pump may source a current (e.g., the control current ICTRL) output from a power supply to an output terminal, or may sink a current from the output terminal to a ground, based on the sampling voltage VSAMP. For example, the loop filter 600 may increase a voltage (e.g., the first output control voltage VCTRL1 and the second output control voltage VCTRL2) based on the sourced current, or may decrease the voltage based on the sunk current.

Detailed configurations and operations of the first transconductance circuit 300 and the second transconductance circuit 400 will be described with reference to FIGS. 6, 7A and 7B.

The voltage controlled oscillator 700 generates the output clock signal CLK_VCO based on the first output control voltage VCTRL1 and the second output control voltage VCTRL2. For example, the voltage controlled oscillator 700 may include a ring oscillator, a RC oscillator, a crystal oscillator, or a temperature compensated crystal oscillator (TCXO), but example embodiments are not limited thereto.

In some example embodiments, an output frequency FVCO of the output clock signal CLK_VCO may be FVCO=Kp*VCTRL1+Ki*VCTRL2, where Kp denotes a gain of the proportional path and Ki denotes a gain of the integral path.

A phase locked loop may perform a function of generating an output clock signal, which has an output frequency different from an input frequency of an input clock signal, by multiplying the input frequency of the input clock signal by a desired (or alternatively, predetermined) number. In this case, phase noise may occur on the output frequency by appropriately filtering phase noise on the input frequency, and the phase noise on the output frequency and performance of the phase locked loop affected by the phase noise may be determined and/or changed depending on a structure of the phase locked loop. For example, one of factors that greatly affects the phase noise on the output frequency may be loop bandwidth (BW), and the loop bandwidth may be determined based on a parameter associated with or related to a transfer function of a block included in the phase locked loop.

A sub-sampling phase locked loop is a type of phase locked loop. The sub-sampling phase locked loop may operate by sampling an output clock signal using an input clock signal (or a reference clock signal). When a ratio of an output frequency of the output clock signal divided by an input frequency of an input clock signal is an integer, the sub-sampling phase locked loop may operate without using a divider, and thus the sub-sampling phase locked loop may be widely used.

Typically, a sub-sampling phase locked loop may include a slope generator and a sampler, and the slope generator and the sampler may include a resistor and a capacitor. In this case, a loop bandwidth of the sub-sampling phase locked loop may be represented as a function of a resistance of the resistor and a capacitance of the capacitor in the slope generator and the sampler. Since resistors and capacitors are passive elements, resistances of the resistors and capacitances of the capacitors may have relatively large distributions when manufacturing in a semiconductor process. Thus, there may be a problem in that the loop bandwidths of the sub-sampling phase locked loops have relatively large distributions.

In the sub-sampling phase locked loop 100 according to some example embodiments, the constant transconductance bias circuit 500 may include the switched capacitor resistor 520, the first transconductance circuit 300 and the second transconductance circuit 400 may be disposed on the proportional path and the integral path, respectively, and the loop filter 600 may include the resistor RLF connected to the output terminal of the first transconductance circuit 300. The influence of the distributions of the resistors and the capacitors included in the slope generating and sampling circuit 200 on the loop bandwidth may be canceled by the capacitor included in the switched capacitor resistor 520 and the resistor RLF included in the loop filter 600. Accordingly, the sub-sampling phase locked loop 100 may have the loop bandwidth in which the influence of process, voltage and temperature (PVT) variation is compensated (e.g., the loop bandwidth relatively insensitive to the PVT variation), and may have improved and/or enhanced performance.

Figure 2:
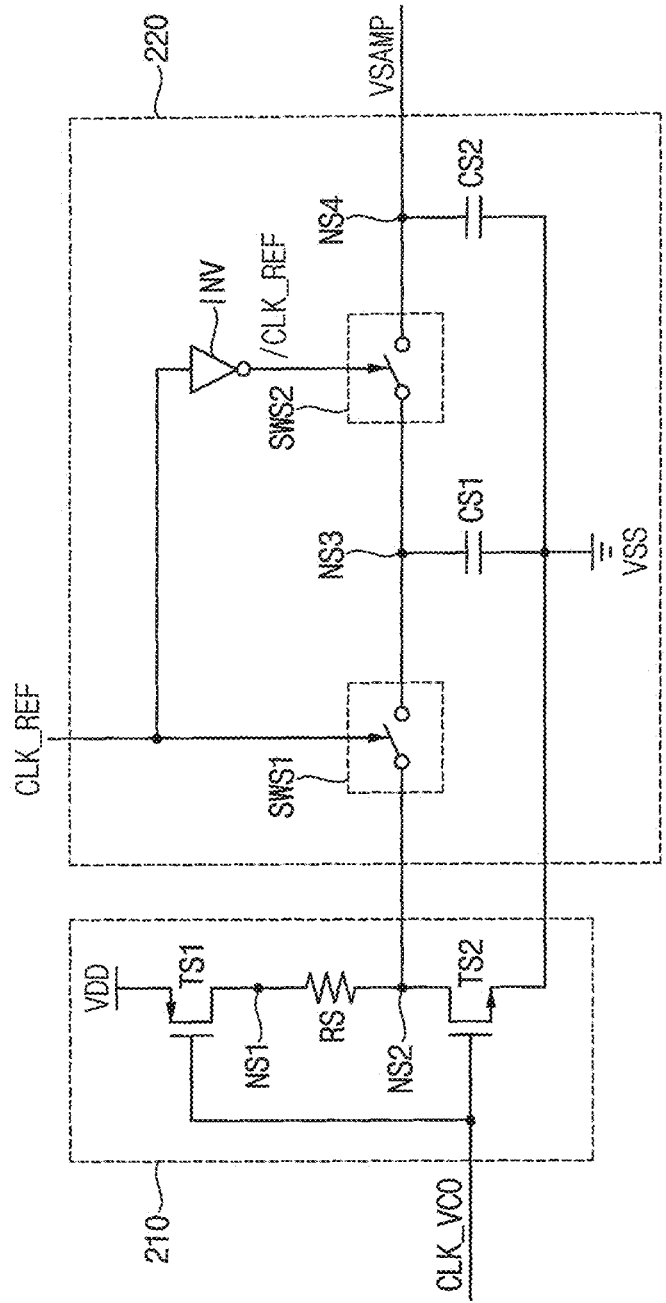
FIG. 2 is a circuit diagram illustrating an example of a slope generating and sampling circuit included in a sub-sampling phase locked loop according to some example embodiments.

FIG. 2 is a circuit diagram illustrating an example of a slope generating and sampling circuit included in a sub-sampling phase locked loop according to some example embodiments.

Referring to FIG. 2, a slope generating and sampling circuit 202 may include a first circuit 210 and a second circuit 220.

The first circuit 210 may be connected between a power supply voltage VDD and a ground voltage VSS and may operate based on the output clock signal CLK_VCO. The first circuit 210 may include transistors TS1 and TS2 and a resistor RS.

The transistor TS1, the resistor RS and the transistor TS2 may be connected in series between the power supply voltage VDD and the ground voltage VSS. For example, the transistor TS1 may be connected between the power supply voltage VDD and a node NS1, the resistor RS may be connected between the node NS1 and a node NS2, and the transistor TS2 may be connected between the node NS2 and the ground voltage VSS. A gate electrode of the transistor TS1 and the gate electrode of the second transistor TS2 may receive the output clock signal CLK_VCO.

In some example embodiments, the transistor TS1 may be a p-type metal oxide semiconductor (PMOS) transistor, and the transistor TS2 may be an n-type metal oxide semiconductor (NMOS) transistor. However, example embodiments may not be limited thereto.

The second circuit 220 may be connected to the first circuit 210 and the ground voltage VSS, may be operate based on the reference clock signal CLK_REF, and may output the sampling voltage VSAMP. The second circuit 220 may include switches SWS1 and SWS2 and capacitors CS1 and CS2, and may further include an inverter INV.

The inverter INV may generate an inverted reference clock signal /CLK_REF in which the reference clock signal CLK_REF is inverted. In some example embodiments, the inverter INV may be disposed outside the second circuit 220 or outside the slope generating and sampling circuit 202.

The switch SWS1 may be connected between the resistor RS and a node NS3, and may be connected between a node NS2 connected to the resistor RS and the node NS3. The switch SWS2 may be connected between the node NS3 and a node NS4. The sampling voltage VSAMP may be output through the node NS4. The capacitor CS1 may be connected between the node NS3 and the ground voltage VSS. The capacitor CS2 may be connected between the node NS4 and the ground voltage VSS.

The switch SWS1 may be turned on and off based on the reference clock signal CLK_REF. The switch SWS2 may be turned on and off based on the inverted reference clock signal /CLK_REF. For example, the switch SWS1 may be turned on and closed when the reference clock signal CLK_REF has a first logic level (e.g., a logic high level), and the switch SWS1 may be turned off and opened when the reference clock signal CLK_REF has a second logic level (e.g., a logic low level). For example, the switch SWS2 may be turned on and closed when the inverted reference clock signal /CLK_REF has the first logic level, and the switch SWS2 may be turned off and opened when the inverted reference clock signal /CLK_REF has the second logic level. In other words, the switches SWS1 and SWS2 may be complementarily turned on and off.

In some example embodiments, each of the switches SWS1 and SWS2 may include at least one transistor.

FIGS. 3A, 3B, 3C and 3D are diagrams for describing an operation of a slope generating and sampling circuit of FIG. 2.

Figure 3A:
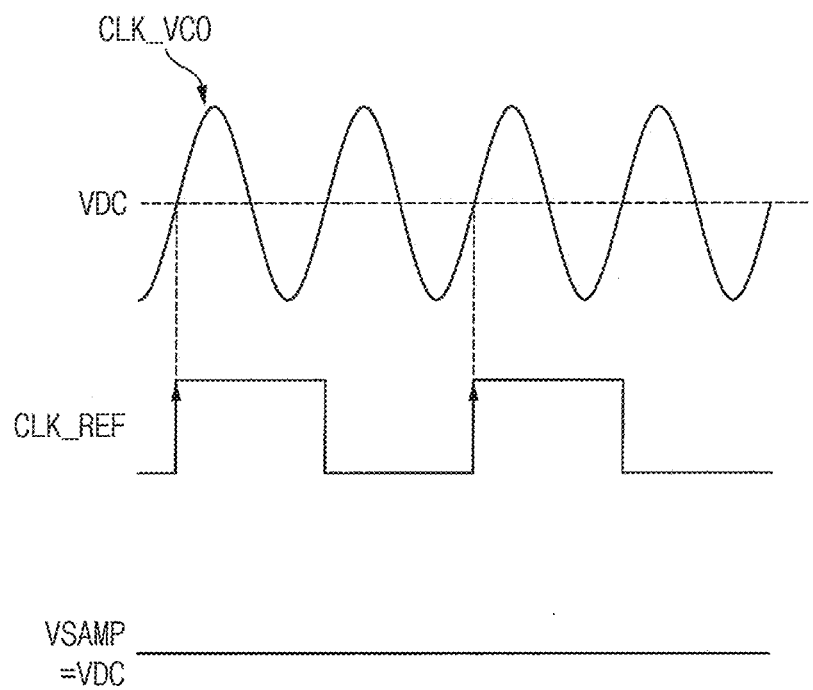
FIGS. 3A, 3B, 3C and 3D are diagrams for describing an operation of a slope generating and sampling circuit of FIG. 2.

Referring to FIG. 3A, the output clock signal CLK_VCO that is generated and output from the sub-sampling phase locked loop 100 may be a sine wave having an amplitude and a direct current (DC) voltage VDC, and may be sampled based on the reference clock signal CLK_REF by the slope generating and sampling circuit 202. When the output clock signal CLK_VCO and the reference clock signal CLK_REF are phase-aligned and there is no phase error between the output clock signal CLK_VCO and the reference clock signal CLK_REF, a voltage level of the sampling voltage VSAMP may have a constant level substantially equal to a voltage level of the DC voltage VDC of the output clock signal CLK_VCO. For example, the voltage level of the DC voltage VDC may be substantially equal to a voltage level of the reference voltage VREF applied to the first transconductance circuit 300 and the second transconductance circuit 400.

Figure 3B:
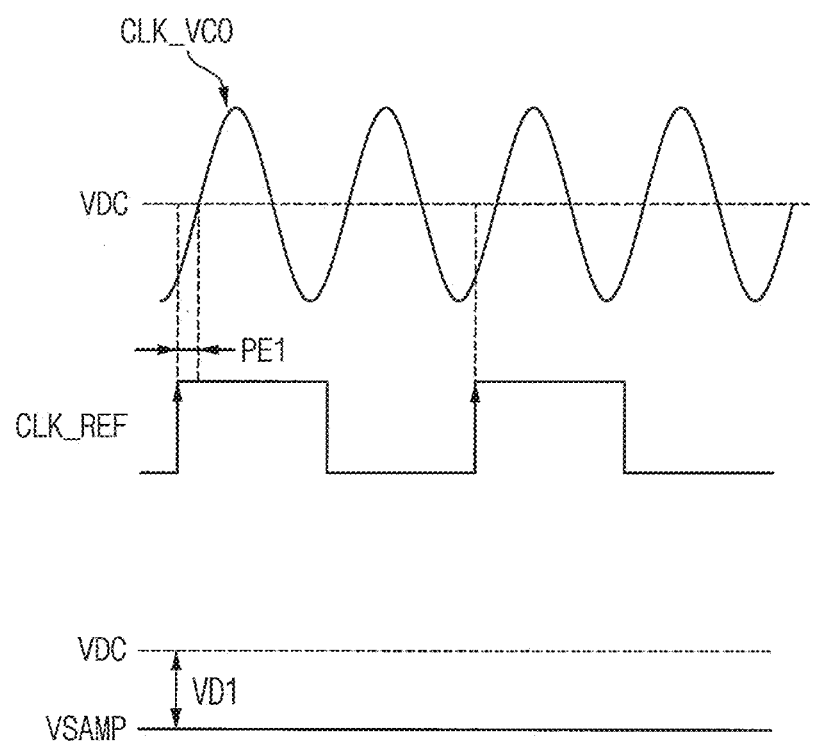

Referring to FIG. 3B, when the phase of the reference clock signal CLK_REF leads the phase of the output clock signal CLK_VCO, e.g., when the phase of the output clock signal CLK_VCO lags behind the phase of the reference clock signal CLK_REF, a first phase error PE1 may exist between the output clock signal CLK_VCO and the reference clock signal CLK_REF, and the sampling voltage VSAMP may have a first voltage level lower than the voltage level of the DC voltage VDC. For example, a first voltage difference VD1 between the voltage level of the sampling voltage VSAMP and the voltage level of the DC voltage VDC may correspond to the first phase error PE1 between the output clock signal CLK_VCO and the reference clock signal CLK_REF. When the voltage level of the sampling voltage VSAMP is lower than the voltage level of the DC voltage VDC, the phase of the output clock signal CLK_VCO may be adjusted or modified in a first direction based on the sampling voltage VSAMP.

Figure 3C:
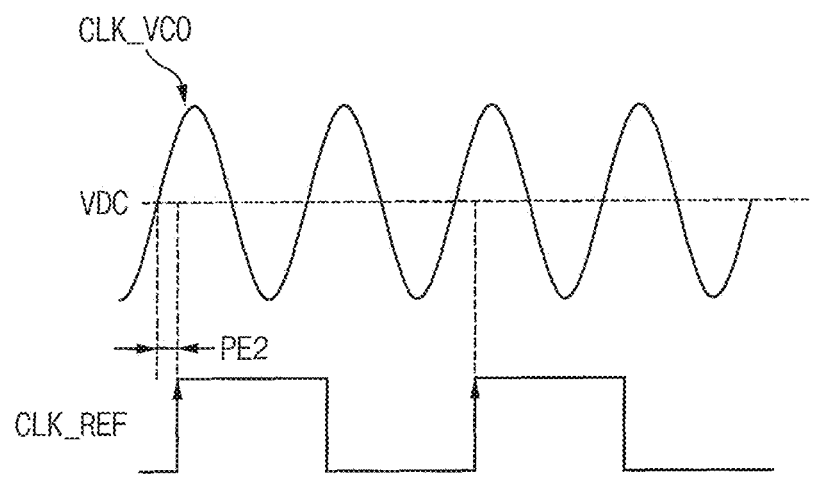
Figure 3C:

Referring to FIG. 3C, when the phase of the reference clock signal CLK_REF lags behind the phase of the output clock signal CLK_VCO, e.g., when the phase of the output clock signal CLK_VCO leads the phase of the reference clock signal CLK_REF, a second phase error PE2 may exist between the output clock signal CLK_VCO and the reference clock signal CLK_REF, and the sampling voltage VSAMP may have a second voltage level higher than the voltage level of the DC voltage VDC. For example, a second voltage difference VD2 between the voltage level of the sampling voltage VSAMP and the voltage level of the DC voltage VDC may correspond to the second phase error PE2 between the output clock signal CLK_VCO and the reference clock signal CLK_REF. When the voltage level of the sampling voltage VSAMP is higher than the voltage level of the DC voltage VDC, the phase of the output clock signal CLK_VCO may be adjusted or modified in a second direction opposite to the first direction based on the sampling voltage VSAMP.

Figure 3D:
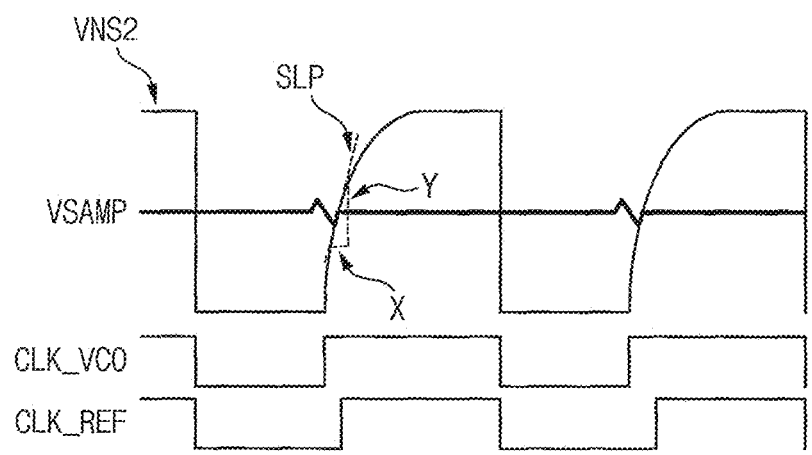

Referring to FIG. 3D, VNS2 denotes a voltage at the node NS2 in FIG. 2, SLP denotes a slope of the sampling voltage VSAMP, and SLP=Y/X. The slope SLP of the sampling voltage VSAMP may be a small signal voltage generated based on the voltage VNS2 at the node NS2. The slope SLP of the sampling voltage VSAMP may be inversely proportional to a resistance of the resistor RS included in the slope generating and sampling circuit 202 of FIG. 2, and may be inversely proportional to capacitances of the capacitors CS1 and CS2 included in the slope generating and sampling circuit 202 of FIG. 2. In other words, the slope SLP of the sampling voltage VSAMP may be represented by Equation 1.

$$SLP \propto \frac{1}{R1 \cdot C1} \qquad \text{[Equation 1]}$$

In Equation 1, R1 denotes the resistance of the resistor RS, and C1 denotes the capacitance of the capacitors CS1 and CS2. For example, C1 may be determined based on at least one of the capacitors CS1 and CS2. For example, C1 may correspond to the capacitance of one of the capacitors CS1 and CS2 (e.g., the capacitance of the capacitor CS1), or may correspond to the capacitances of both the capacitors CS1 and CS2 (e.g., an average capacitance of the capacitors CS1 and CS2).

Although the configuration and operation of the slope generating and sampling circuit 202 are described with reference to FIGS. 2, 3A, 3B, 3C and 3D, example embodiments are not limited thereto, and the configuration and operation of the slope generating and sampling circuit 200 may be variously determined according to some example embodiments.

Figure 4:
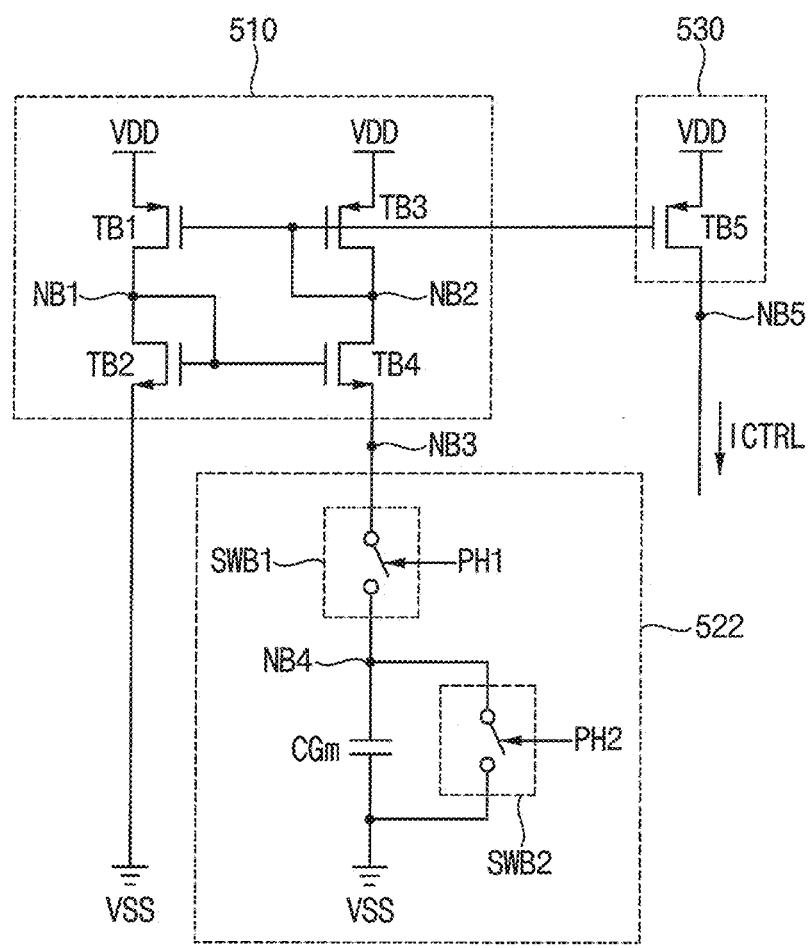
FIG. 4 is a circuit diagram illustrating an example of a constant transconductance bias circuit included in a sub-sampling phase locked loop according to some example embodiments.

FIG. 4 is a circuit diagram illustrating an example of a constant transconductance bias circuit included in a sub-sampling phase locked loop according to some example embodiments.

Referring to FIG. 4, a constant transconductance bias circuit 502 may include a first circuit 510, a switched capacitor resistor 522 and a second circuit 530.

The first circuit 510 may be connected between the power supply voltage VDD and the ground voltage VSS. The first circuit 510 may include transistors TB1, TB2, TB3 and TB4.

The transistor TB1 and the transistor TB2 may be connected in series between the power supply voltage VDD and the ground voltage VSS. For example, the transistor TB1 may be connected between the power supply voltage VDD and a node NB1, and the transistor TB2 may be connected between a node NB1 and the ground voltage VSS. The transistor TB3 and the transistor TB4 may be connected in series between the power supply voltage VDD and a node NB3. For example, the transistor TB3 may be connected between the power supply voltage VDD and a node NB2, and the transistor TB4 may be connected between the node NB2 and the node NB3. A gate electrode of the transistor TB1 and a gate electrode of the transistor TB3 may be connected to each other, and may be connected to the node NB2. A gate electrode of the transistor TB2 and the gate electrode of the transistor TB4 may be connected to each other, and may be connected to the node NB1.

In some example embodiments, the transistors TB1 and TB3 may be PMOS transistors, and the transistors TB2 and TB4 may be NMOS transistors. However, example embodiments may not be limited thereto.

The switched capacitor resistor 522 may be connected between the first circuit 510 and the ground voltage VSS and may be connected between the node NB3 connected to the first circuit 510 and the ground voltage VSS. The switched capacitor resistor 522 may operate based on a first phase signal PH1 and a second phase signal PH2. The switched capacitor resistor 522 may include switches SWB1 and SWB2 and a capacitor CGm.

The switch SWB1 may be connected between the node NB3 and a node NB4. The capacitor CGm may be connected between the node NB4 and the ground voltage VSS. The switch SWB2 may be connected in parallel with the capacitor CGm between the node NB4 and the ground voltage VSS.

The switch SWB1 may be turned on and off based on the first phase signal PH1. The switch SWB2 may be turned on and off based on the second phase signal PH2. For example, the switch SWB1 may be turned on and closed when the first phase signal PH1 has a first logic level (e.g., a logic high level), and may be turned off and opened when the first phase signal PH1 has a second logic level (e.g., a logic low level). For example, the switch SWB2 may be turned on and closed when the second phase signal PH2 has the first logic level, and may be turned off and opened when the second phase signal PH2 has the second logic level.

In some example embodiments, each of the switches SWB1 and SWB2 may include at least one transistor.

The second circuit 530 may be connected to the power supply voltage VDD and the first circuit 510 and may output the control current ICTRL. The second circuit 530 may include a transistor TB5.

The transistor TB5 may be connected between the power supply voltage VDD and a node NB5. The control current ICTRL may be output through the node NB5. A gate electrode of the transistor TB5 may be connected to the gate electrode of the transistor TB1 and the gate electrode of the transistor TB3.

In some example embodiments, the transistor TB5 may be a PMOS transistor. However, example embodiments may not be limited thereto.

Unlike a constant transconductance bias circuit included in a conventional sub-sampling phase locked loop, the constant transconductance bias circuit 502 included in the sub-sampling phase locked loop 100 according to some example embodiments may further include the switched capacitor resistor 522.

Figure 5A:
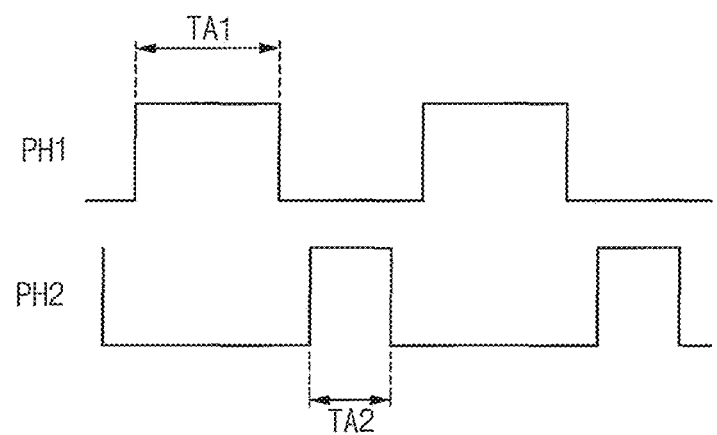
FIGS. 5A, 5B and 5C are diagrams for describing an operation of a constant transconductance bias circuit of FIG. 4.
Figure 5B:
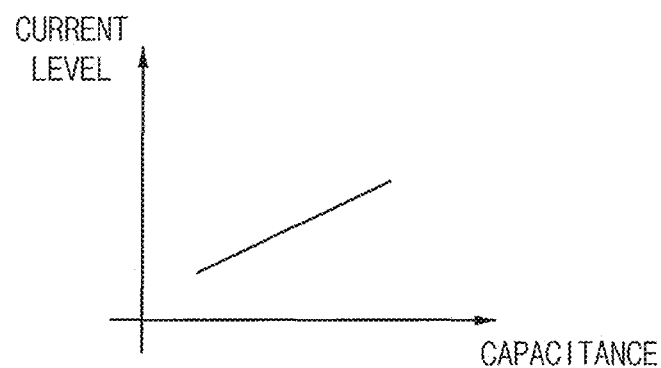
Figure 5C:
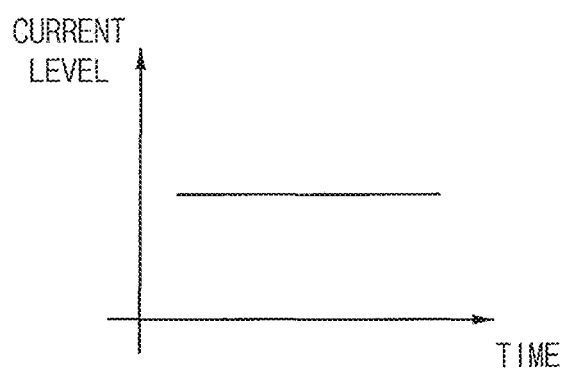

FIGS. 5A, 5B and 5C are diagrams for describing an operation of a constant transconductance bias circuit of FIG. 4.

Referring to FIG. 5A, an example of the first phase signal PH1 and the second phase signal PH2 applied to the switched capacitor resistor 522 in FIG. 4 is illustrated.

An active (or activation) duration TA1 of the first phase signal PH1 and an active duration TA2 of the second phase signal PH2 may not overlap, and thus the switches SWB1 and SWB2 may not be simultaneously or concurrently turned on (e.g., may not be simultaneously or concurrently closed).

The switched capacitor resistor 522 is the simplest switched capacitor. The switched capacitor resistor 522 may include one capacitor CGm and two switches SWB1 and SWB2 which connect the capacitor CGm with a given frequency (e.g., based on the phase signals PH1 and PH2) alternately to an input and an output of the switched capacitor resistor 522. In each switching cycle, charges q may be transferred from the input to the output according to a switching frequency f. In a typical capacitor, $q=C*V$, where C denotes a capacitance of the capacitor and V denotes a voltage across the capacitor. Based on the above-described features, an operation of the switched capacitor resistor 522 will be described as follows.

In the switched capacitor resistor 522, when one of the switches SWB1 and SWB2 (e.g., SWB1) is closed while the other of the switches SWB1 and SWB2 (e.g., SWB2) is open, charges input and stored in the capacitor CGm may be $q1=Cgm*V1$, where V1 denotes an input voltage of the switched capacitor resistor 522. When one of the switches SWB1 and SWB2 (e.g., SWB1) is open while the other of the switches SWB1 and SWB2 (e.g., SWB2) is closed, some of the charges (e.g., q1) stored in the capacitor CGm may be transferred out of the capacitor CGm, and then charges remaining in the capacitor CGm may be $q2=Cgm*V2$, where V2 is an output voltage of the switched capacitor resistor 522. Thus, charges moved out of the capacitor CGm to the output may be $q3=q1-q2=Cgm*(V1-V2)$. Since the charges q3 are transferred at a rate of the switching frequency f, a rate of transfer of charge per unit time may be $ISCR=q*f=Cgm*(V1-V2)*f$. (A continuous transfer of charge from one node to another is equivalent to a current, so "I" (the symbol for electric current) is used.) A voltage across the switched capacitor resistor 522 from an input to an output may be $VSCR=V1-V2$, so an equivalent resistance (e.g., a voltage-current relationship) may be RSCR=VSCR/ISCR=1/(Cgm*f). Thus, the switched capacitor resistor 522 may operate as a resistor whose resistance depends on a capacitance of the capacitor CGm and the switching frequency f.

The switched capacitor resistor 522 may be used as a replacement for simple resistors in integrated circuits because it is easier to fabricate reliably with a wide range of values. The switched capacitor resistor 522 may also have benefits that its value may be adjusted by changing the switching frequency f (e.g., it is a programmable resistance).

Referring to FIG. 5B, a relationship between a current level of the control current ICTRL generated by the constant transconductance bias circuit 502 of FIG. 4 and a capacitance of the capacitor CGm included in the switched capacitor resistor 522 in FIG. 4 is illustrated. As illustrated in FIG. 5B, the current level of the control current ICTRL may be proportional to the capacitance of the capacitor CGm. In other words, the current level of the control current ICTRL may increase as the capacitance of the capacitor CGm increases, and the current level of the control current ICTRL may decrease as the capacitance of the capacitor CGm decreases.

Referring to FIG. 5C, a change in the current level of the control current ICTRL generated by the constant transconductance bias circuit 502 of FIG. 4 over time is illustrated. As illustrated in FIG. 5C, the current level of the control current ICTRL may always be constant regardless of time. In other words, the constant transconductance bias circuit 502 may operate as a constant current source.

Although the configuration and operation of the constant transconductance bias circuit 502 are described with reference to FIGS. 4, 5A, 5B and 5C, example embodiments are not limited thereto, and the configuration and operation of the constant transconductance bias circuit 502 may be variously determined according to some example embodiments.

Figure 6:
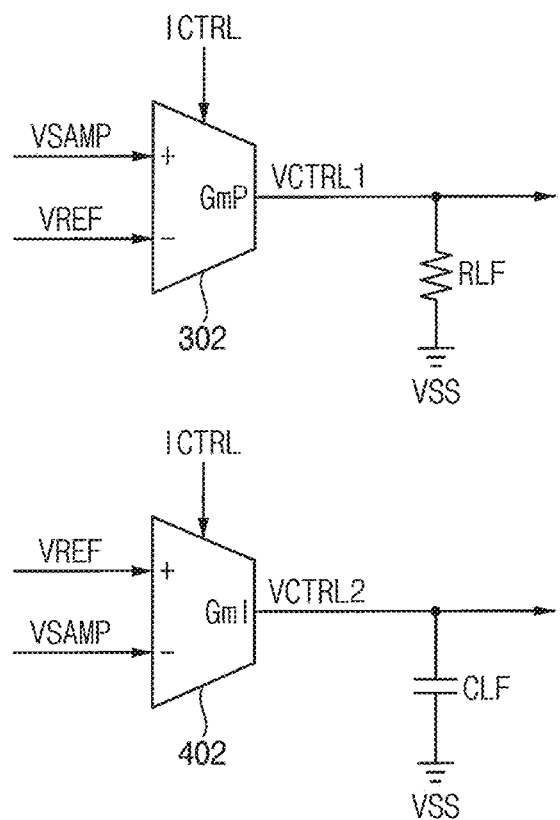
FIG. 6 is a diagram illustrating an example of a first transconductance circuit, a second transconductance circuit and a loop filter included in a sub-sampling phase locked loop according to some example embodiments.

FIG. 6 is a diagram illustrating an example of a first transconductance circuit, a second transconductance circuit and a loop filter included in a sub-sampling phase locked loop according to some example embodiments.

Referring to FIG. 6, a first transconductance circuit (GmP) 302 may correspond to the first transconductance circuit 300 in FIG. 1, and a second transconductance circuit (GmI) 402 may correspond to the second transconductance circuit 400 in FIG. 1. The resistor RLF and the capacitor CLF may correspond to the resistor RLF and the capacitor CLF included in the loop filter 600 in FIG. 1, respectively.

The first transconductance circuit 302 may include a first input terminal (e.g., a positive (+) input terminal) that receives the sampling voltage VSAMP, and a second input terminal (e.g., a negative (−) input terminal) that receives the reference voltage VREF. The first transconductance circuit 302 may operate based on the control current ICTRL, and may generate the first output control voltage VCTRL1. The resistor RLF may be connected between an output terminal of the first transconductance circuit 302, which outputs the first output control voltage VCTRL1, and the ground voltage VSS. The proportional path of the sub-sampling phase locked loop 100 may be formed by the first transconductance circuit 302 and the resistor RLF.

The second transconductance circuit 402 may include a first input terminal (e.g., a positive (+) input terminal) that receives the reference voltage VREF, and a second input terminal (e.g., a negative (−) input terminal) that receives the sampling voltage VSAMP. The second transconductance circuit 402 may operate based on the control current ICTRL, and may generate the second output control voltage VCTRL2. The capacitor CLF may be connected between an output terminal of the second transconductance circuit 402, which outputs the second output control voltage VCTRL2, and the ground voltage VSS. The integral path of the sub-sampling phase locked loop 100 may be formed by the second transconductance circuit 402 and the capacitor CLF.

The configurations of the first transconductance circuit 302 and the second transconductance circuit 402 may be variously determined according to some example embodiments, and example embodiments may not be limited to a transconductance circuit having a specific structure. In some example embodiments, the first transconductance circuit 302 and the second transconductance circuit 402 may have the same structure. In other example embodiments, the first transconductance circuit 302 and the second transconductance circuit 402 may have different structures.

In a conventional sub-sampling phase locked loop, a loop filter includes a resistor and a capacitor that are electrically and/or directly connected to each other. In contrast, in the sub-sampling phase locked loop 100 according to some example embodiments, the loop filter 600 may have a dual-loop structure, and the resistor RLF and the capacitor CLF in the loop filter 600 may not be electrically and/or directly connected to each other but may be electrically and/or physically separated from each other. In addition, the conventional sub-sampling phase locked loop includes only one transconductance circuit. However, the sub-sampling phase locked loop 100 according to some example embodiments may include two transconductance circuits 302 and 402 separated from each other, each transconductance circuit may be used to drive a respective one of the separate components (e.g., the resistor RLF and the capacitor CLF) of the loop filter 600. For example, the first transconductance circuit 302 may be used to drive the resistor RLF, and the second transconductance circuit 402 may be used to drive the capacitor CLF.

Figure 7A:
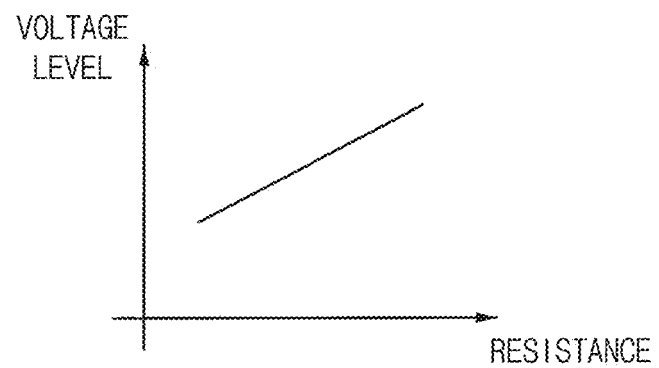
FIGS. 7A and 7B are diagrams for describing an operation of a first transconductance circuit and a loop filter of FIG. 6.
Figure 7B:
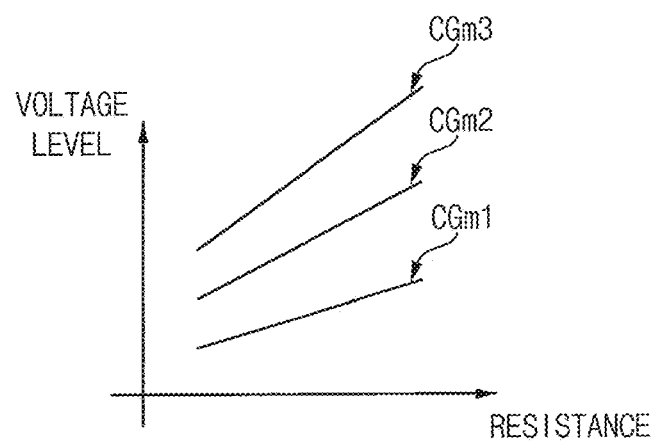

FIGS. 7A and 7B are diagrams for describing an operation of a first transconductance circuit and a loop filter of FIG. 6.

Referring to FIG. 7A, a relationship between a voltage level of the first output control voltage VCTRL1 generated by the first transconductance circuit 302 of FIG. 6 and a resistance of the resistor RLF included in the loop filter 600 of FIG. 6 is illustrated. As illustrated in FIG. 7A, the voltage level of the first output control voltage VCTRL1 may be proportional to the resistance of the resistor RLF. In other words, the voltage level of the first output control voltage VCTRL1 may increase as the resistance of the resistor RLF increases, and the voltage level of the first output control voltage VCTRL1 may decrease as the resistance of the resistor RLF decreases.

Referring to FIG. 7B, a relationship between the voltage level of the first output control voltage VCTRL1 generated by the first transconductance circuit 302 of FIG. 6 and the capacitance of the capacitor CGm included in the switched capacitor resistor 522 in FIG. 4 is illustrated. As described with reference to FIG. 5B, the voltage level of the control current ICTRL used to drive the first transconductance circuit 302 may be proportional to the capacitance of the capacitor CGm. Thus, as illustrated in FIG. 7B, the voltage level of the first output control voltage VCTRL1 may be proportional to the capacitance of the capacitor CGm. In other words, the voltage level of the first output control voltage VCTRL1 may increase as the capacitance of the capacitor CGm increases, and the voltage level of the first output control voltage VCTRL1 may decrease as the capacitance of the capacitor CGm decreases.

For example, there may be three cases in which the capacitor CGm has a first capacitance CGm1, a second capacitance CGm2 and a third capacitances CGm3, and it may be assumed that the resistances of the registers RLF are equal to each other in all three cases. A voltage level of the first output control voltage VCTRL1 when the capacitor CGm has the first capacitance CGm1 may be lower than a voltage level of the first output control voltage VCTRL1 when the capacitor CGm has the second capacitance CGm2, and the first capacitance CGm1 may be smaller than the second capacitance CGm2. In addition, the voltage level of the first output control voltage VCTRL1 when the capacitor CGm has the second capacitance CGm2 may be lower than a voltage level of the first output control voltage VCTRL1 when the capacitor CGm has the third capacitance CGm3, and the second capacitance CGm2 may be smaller than the third capacitance CGm3. In other words, CGm1<CGm2<CGm3, and thus VCTRL1(CGm1)<VCTRL1(CGm2)<VCTRL1(CGm3).

As described with reference to FIGS. 7A and 7B, the voltage level of the first output control voltage VCTRL1 may be proportional to the resistance of the resistor RLF included in the loop filter 600 of FIG. 6, and may be proportional to the capacitance of the capacitor CGm included in the switched capacitor resistor 522 in the constant transconductance bias circuit 502 of FIG. 4. In other words, the voltage level of the first output control voltage VCTRL1 may be represented by Equation 2.

$$VCTRL1 \alpha R2 \cdot C2 \quad \text{[Equation 2]}$$

In Equation 2, R2 denotes the resistance of the resistor RLF, and C2 denotes the capacitance of the capacitor CGm.

When a conventional sub-sampling phase locked loop includes only a slope generating and sampling circuit (e.g., the slope generating and sampling circuit 202 of FIG. 2), e.g., when the conventional sub-sampling phase locked loop does not include the switched capacitor resistor 520 and includes only one transconductance circuit, a loop bandwidth LBWc may satisfy Equation 3.

$$LBWc \propto \frac{1}{R1 \cdot C1} \cdot Kp$$

In Equation 3, R1 denotes a resistance of a resistor (e.g., the resistor RS in FIG. 2), and C1 denotes a capacitance of a capacitor (e.g., the capacitors CS1 and CS2 in FIG. 2), as described with reference to Equation 1. Kp denotes a gain of a proportional path including the transconductance circuit.

As described above, when the sub-sampling phase locked loop includes only the slope generating and sampling circuit 202, the loop bandwidth LBWc of the sub-sampling phase locked loop may be represented as a function of the resistance of the resistor RS and the capacitance of the capacitors CS1 and CS2. The resistor RS and the capacitors CS1 and CS2 may be passive elements and may have relatively large distributions (e.g., about 20%) when manufacturing in a semiconductor process, and thus the loop bandwidth LBWc of the sub-sampling phase-locked loop may have a relatively large distribution corresponding to a multiplication of the resistance of the resistor RS and the capacitance of the capacitors CS1 and CS2.

In contrast, when the sub-sampling phase locked loop 100 according to some example embodiments includes the switched capacitor resistor 522, two transconductance circuits 302 and 402 and the loop filter 600, e.g., when the loop filter 600 is implemented in the dual-loop structure, the two transconductance circuits 300 and 400 separated from each other drive the separate components (e.g., the resistor RLF and the capacitor CLF) in the loop filter 600, and the constant transconductance bias circuit 500 includes the switched capacitor resistor 520, a loop bandwidth LBWp may satisfy Equation 4 and Equation 5.

$$LBWp \propto \frac{1}{R2 \cdot C2} \cdot R2 \cdot C2 \cdot Kp \quad \text{[Equation 4]}$$

$$LBWp \propto Kp \quad \text{[Equation 5]}$$

In Equation 4 and Equation 5, R1 denotes the resistance of the resistor RS, and C1 denotes the capacitance of the capacitors CS1 and CS2, as described with reference to Equation 1. R2 denotes the resistance of the resistor RLF, and C2 denotes the capacitance of the capacitor CGm, as described with reference to Equation 2. Kp denotes a gain of the proportional path including the first transconductance circuit 302.

As described above, the loop bandwidth LBWp of the sub-sampling phase locked loop 100 according to some example embodiments may be proportional only to the gain Kp of the proportional path. For example, as represented in Equation 4, the influence of the distributions of the resistor RS and the capacitors CS1 and CS2 included in the slope generating and sampling circuit 202 on the loop bandwidth LBWp may be canceled by the capacitor CGm included in the switched capacitor resistor 522 and the resistor RLF included in the loop filter 600. Accordingly, the influence of external factors such as PVT on the loop bandwidth may be reduced, and thus the sub-sampling phase locked loop 100 may have the loop bandwidth in which the influence of the PVT variation is compensated (e.g., the loop bandwidth relatively insensitive to the PVT variation) and may have improved and/or enhanced performance.

Figure 8:
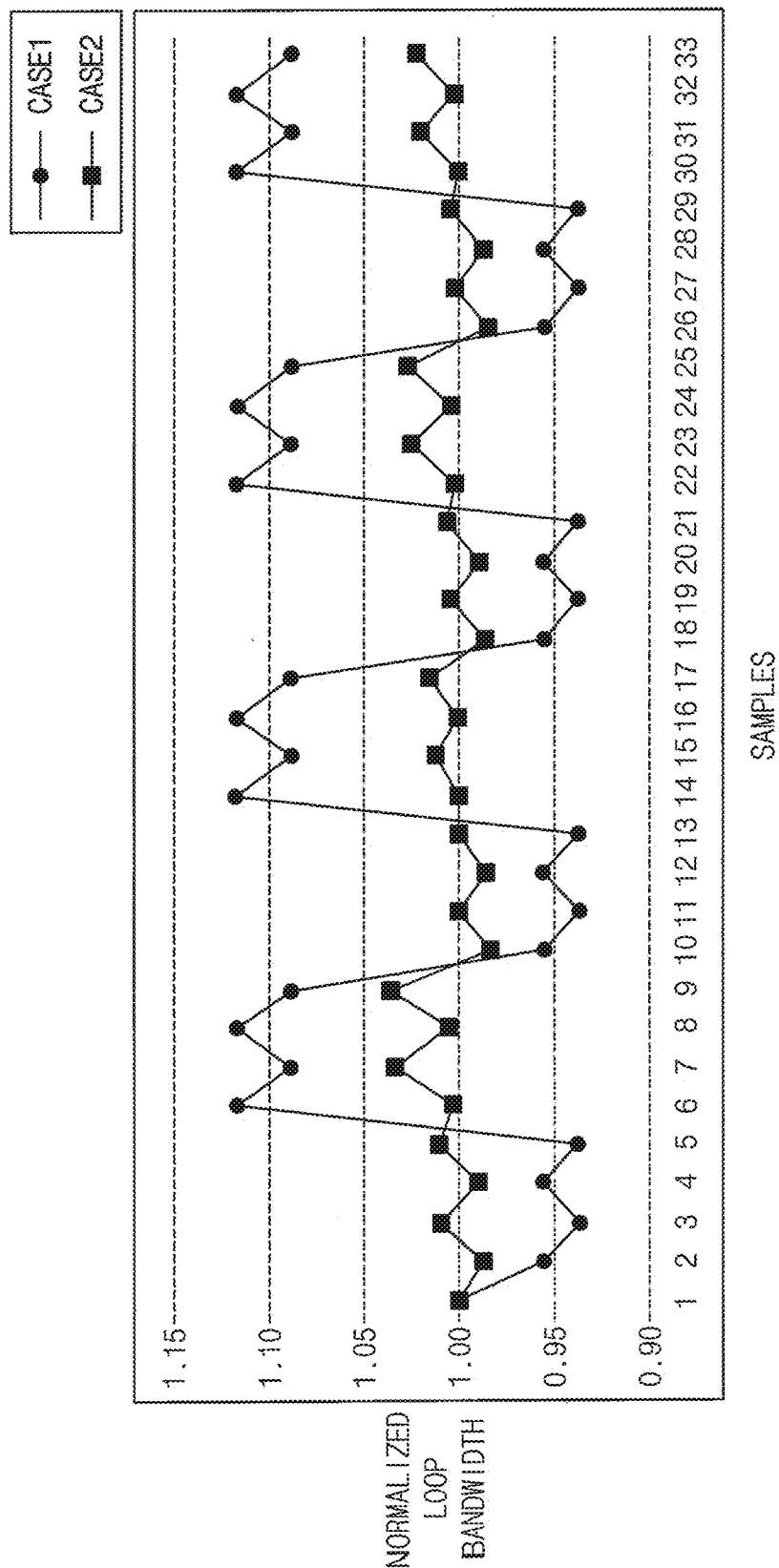
FIG. 8 is a diagram for describing performance of a sub-sampling phase locked loop according to some example embodiments.

FIG. 8 is a diagram for describing performance of a sub-sampling phase locked loop according to some example embodiments.

Referring to FIG. 8, CASE1 represents the conventional sub-sampling phase locked loop including only the slope generating and sampling circuit, and CASE2 represents the sub-sampling phase locked loop 100 according to some example embodiments including the switched capacitor resistor 522, two transconductance circuits 302 and 402 and the loop filter 600. Thirty-three samples are prepared for each case, and the loop bandwidth of each sample is normalized to one and plotted. The loop bandwidth of the conventional sub-sampling phase locked loop may have a distribution of about 0.94 to 1.12 (e.g., a distribution of about 18%), and the loop bandwidth of the sub-sampling phase locked loop 100 according to some example embodiments may have a distribution of about 0.98 to 1.04 (e.g., a distribution of about 6%). Therefore, it can be seen that the loop bandwidth of the sub-sampling phase locked loop 100 according to some example embodiments is remarkably improved.

Figure 9:
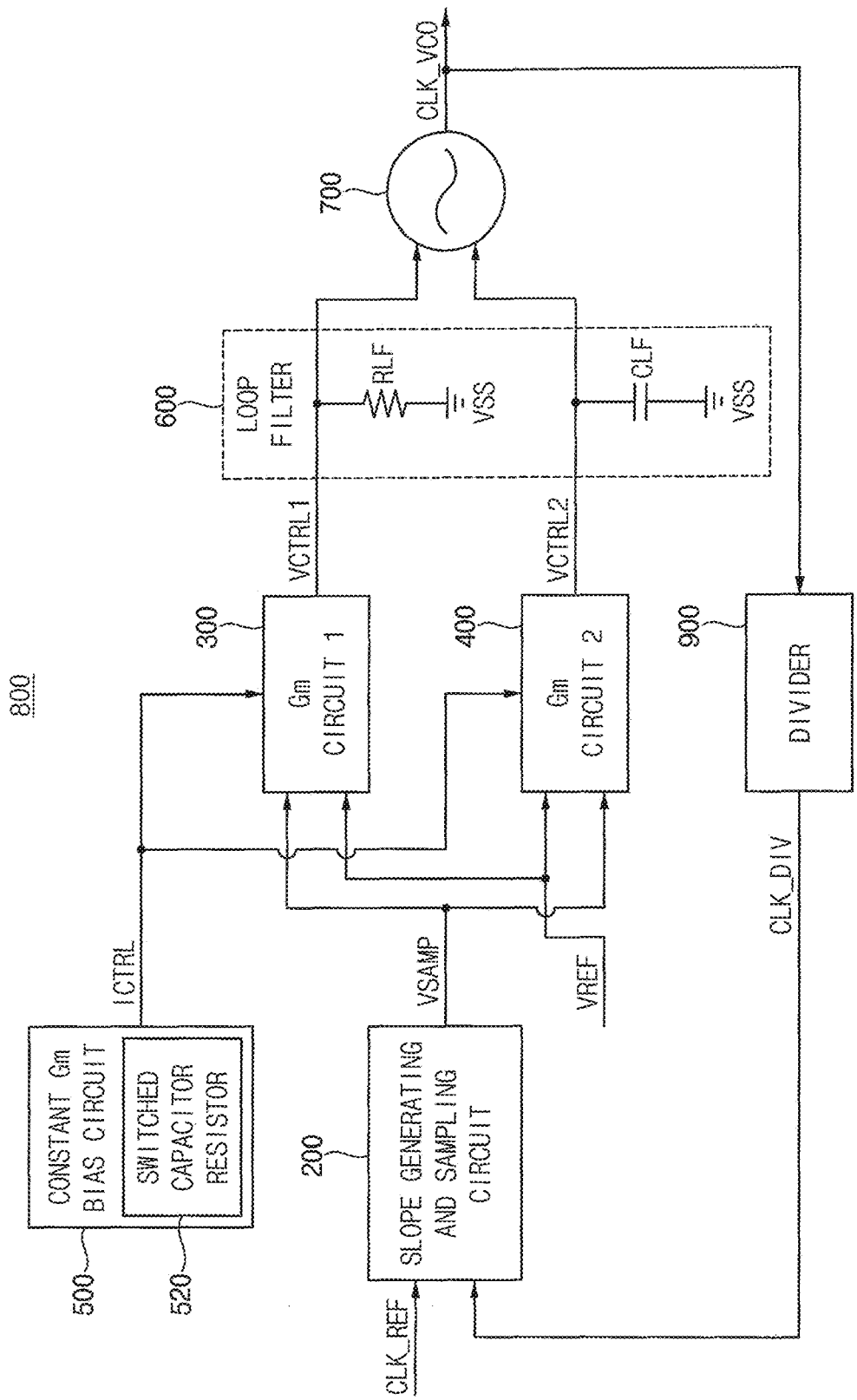
FIG. 9 is a block diagram illustrating a sampling phase locked loop according to some example embodiments.

FIG. 9 is a block diagram illustrating a sampling phase locked loop according to some example embodiments.

Referring to FIG. 9, a sampling phase locked loop 800 includes a slope generating and sampling circuit 200, a first transconductance circuit 300, a second transconductance circuit 400, a constant transconductance bias circuit 500, a loop filter 600, a voltage controlled oscillator 700 and a divider 900.

The sampling phase locked loop 800 of FIG. 9 may be substantially the same as the sub-sampling phase locked loop 100 of FIG. 1, except that the sampling phase locked loop 800 further includes the divider 900 and thus an operation of the sampling phase locked loop 800 is partially changed.

The divider 900 may generate a divided clock signal CLK_DIV by dividing the output clock signal CLK_VCO. For example, a frequency of the divided clock signal CLK_DIV may be lower than the frequency of the output clock signal CLK_VCO.

In some example embodiments, the divider 900 may be an integer divider. For example, a division ratio of the divider 900, e.g., a value obtained by dividing the frequency of the output clock signal CLK_VCO by the frequency of the divided clock signal CLK_DIV may be an integer. In other example embodiments, the divider 900 may be a fractional divider. For example, a division ratio of the divider 900, e.g., a value obtained by dividing the frequency of the output clock signal CLK_VCO by the frequency of the divided clock signal CLK_DIV may be a real number.

The slope generating and sampling circuit 200 may generate the sampling voltage VSAMP based on the reference clock signal CLK_REF and the divided clock signal CLK_DIV. In this case, the sampling voltage VSAMP may correspond to a phase error between the reference clock signal CLK_REF and the divided clock signal CLK_DIV.

The first transconductance circuit 300, the second transconductance circuit 400, the constant transconductance bias circuit 500, the loop filter 600 and the voltage controlled oscillator 700 in FIG. 9 may be substantially the same as the first transconductance circuit 300, the second transconductance circuit 400, the constant transconductance bias circuit 500, the loop filter 600 and the voltage controlled oscillator 700 in FIG. 1, respectively, and may be implemented as described with reference to FIGS. 2 through 8.

In the sampling phase locked loop 800 according to some example embodiments, the constant transconductance bias circuit 500 may include the switched capacitor resistor 520, the first transconductance circuit 300 and the second transconductance circuit 400 may be disposed on the proportional path and the integral path, respectively, and the loop filter 600 may include the resistor RLF connected to the output terminal of the first transconductance circuit 300. The influence of the distributions of the resistors and the capacitors included in the slope generating and sampling circuit 200 on the loop bandwidth may be canceled by the capacitor included in the switched capacitor resistor 520 and the resistor RLF included in the loop filter 600. Accordingly, the sampling phase locked loop 800 may have the loop bandwidth in which the influence of the PVT variation is compensated (e.g., the loop bandwidth relatively insensitive to the PVT variation), and may have improved and/or enhanced performance.

In some example embodiments, at least some components of the sub-sampling phase locked loop 100 and the sampling phase locked loop 800 may be implemented as hardware. For example, at least some components of the sub-sampling phase locked loop 100 and the sampling phase locked loop 800 may be included in a computer-based electronic system. In other example embodiments, at least some components of the sub-sampling phase locked loop 100 and the sampling phase locked loop 800 may be implemented as instruction codes or program routines (e.g., a software program). For example, the instruction codes or the program routines may be executed by a computer-based electronic system, and may be stored in any storage device located inside or outside the computer-based electronic system.

Figure 10:
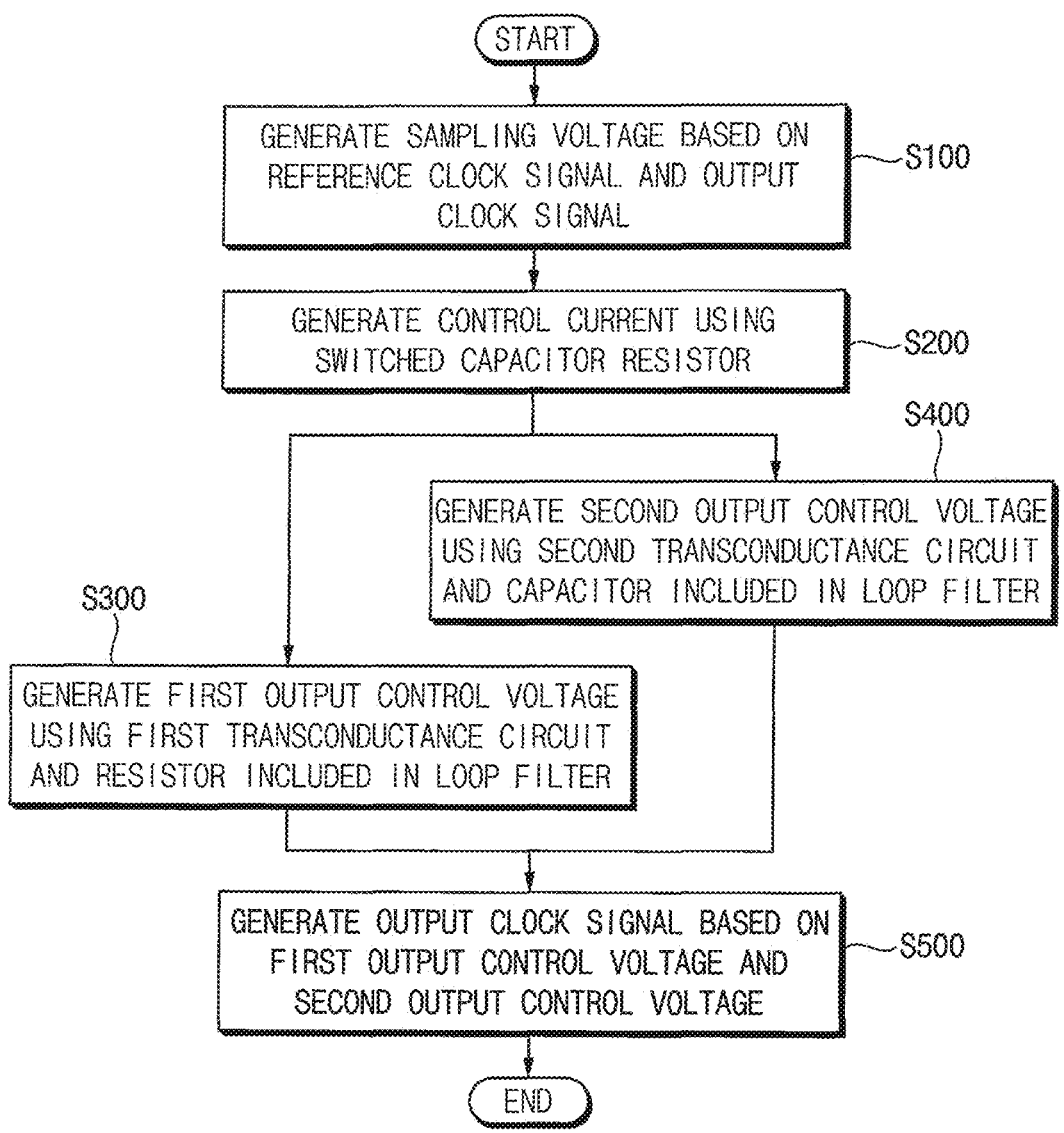
FIG. 10 is a flowchart illustrating a method of generating a clock signal according to some example embodiments.

FIG. 10 is a flowchart illustrating a method of generating a clock signal according to some example embodiments.

Referring to FIGS. 1 and 10, a method of generating a clock signal according to some example embodiments is performed by the sub-sampling phase locked loop 100 according to some example embodiments. As described with reference to FIG. 1, the sub-sampling phase locked loop 100 may perform the sampling-based phase detecting operation. In addition, in the sub-sampling phase locked loop 100, the constant transconductance bias circuit 500 may include the switched capacitor resistor 520, the first transconductance circuit 300 and the second transconductance circuit 400 may be disposed on the proportional path and the integral path, respectively, and the loop filter 600 may include the resistor RLF connected to the output terminal of the first transconductance circuit 300. The method of generating the clock signal may be described as a method of operating a sub-sampling phase locked loop.

In the method of generating the clock signal according to some example embodiments, the sampling voltage VSAMP is generated based on the reference clock signal CLK_REF and the output clock signal CLK_VCO (step S100). For example, step S100 may be performed by the slope generating and sampling circuit 200 and may be performed as described with reference to FIGS. 2, 3A, 3B, 3C and 3D.

The control current ICTRL is generated using the constant transconductance bias circuit 500 including the switched capacitor resistor (SCR) 520 (step S200). For example, step S200 may be performed as described with reference to FIGS. 4, 5A, 5B and 5C.

The first output control voltage VCTRL1 is generated using the first transconductance circuit (GmP) 300 and the resistor RLF included in the loop filter 600 (step S300). For example, the first output control voltage VCTRL1 may be generated based on the sampling voltage VSAMP, the reference voltage VREF and the control current ICTRL. For example, step S300 may be performed as described with reference to FIGS. 6, 7A and 7B.

The second output control voltage VCTRL2 is generated using the second transconductance circuit (GmI) 400 and the capacitor CLF included in the loop filter 600 (step S400). For example, the second output control voltage VCTRL2 may be generated based on the sampling voltage VSAMP, the reference voltage VREF and the control current ICTRL. Steps S300 and S400 may be performed substantially simultaneously or concurrently.

The output clock signal CLK_VCO is generated based on the first output control voltage VCTRL1 and the second output control voltage VCTRL2 (step S500). For example, step S500 may be performed by the voltage controlled oscillator 700.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 11:
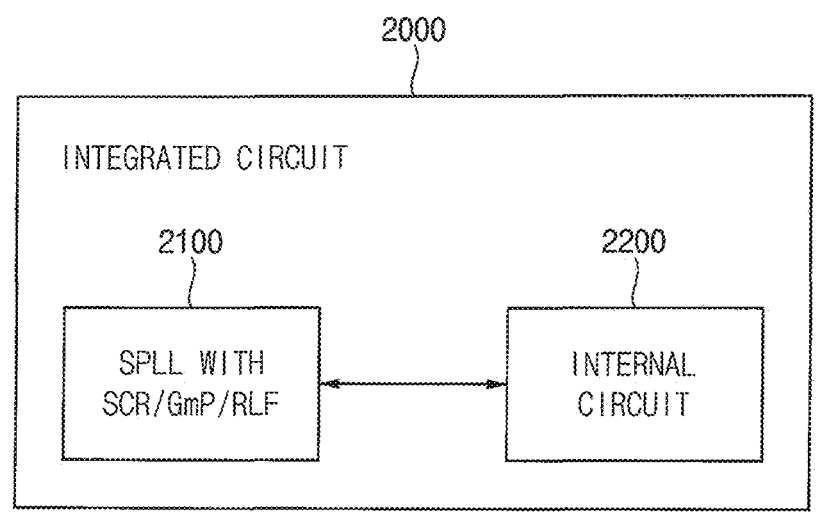
FIG. 11 is a block diagram illustrating an integrated circuit according to some example embodiments.

FIG. 11 is a block diagram illustrating an integrated circuit according to some example embodiments.

Referring to FIG. 11, an integrated circuit 2000 includes a phase locked loop (SPLL) 2100 and an internal circuit 2200.

The phase locked loop 2100 may include the sub-sampling phase locked loop according to some example embodiments (e.g., the sub-sampling phase locked loop 100 of FIG. 1) and/or the sampling phase locked loop according to some example embodiments (e.g., the sampling phase locked loop 800 of FIG. 9). The phase locked loop 2100 may perform the sampling-based phase detecting operation. In addition, in the phase locked loop 2100, the loop filter 600 may be implemented in the dual-loop structure, the two transconductance circuits 300 and 400 separated from each other may drive the separate components (e.g., the resistor RLF and the capacitor CLF) in the loop filter 600, and the constant transconductance bias circuit 500 may include the switched capacitor resistor 520. Accordingly, the influence of the distributions of the resistors and the capacitors on the loop bandwidth may be canceled, and thus the phase locked loop 2100 may have the loop bandwidth in which the influence of the PVT variation is compensated (e.g., the loop bandwidth relatively insensitive to the PVT variation) and may have improved and/or enhanced performance. The phase locked loop 2100 may include SCR 520, GmP 302, and resistor RLF.

The internal circuit 2200 may operate (or may be driven) or may perform a specific operation based on an output clock signal generated from the phase locked loop 2100.

FIG. 12 is a block diagram illustrating a digital processing system according to some example embodiments.

Referring to FIG. 12, a digital processing system 3000 includes a master device 3100 and a plurality of slave devices 3200, 3300, 3400, 3500, 3600, 3700, 3800 and 3900.

In some example embodiments, the digital processing system 3000 may be any electronic system, such as a personal computer (PC), a mobile phone, a smart phone, a tablet computer, a laptop computer, a personal digital assistant (PDA), an enterprise digital assistant (EDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The master device 3100 may be a controller circuit or a processor which can actively control the plurality of slave devices 3200, 3300, 3400, 3500, 3600, 3700, 3800 and 3900. For example, the master device 3100 may be implemented as a baseband modem processor chip, a chip which can function as both a modem and an application processor (AP), an AP, or a mobile AP, but example embodiments are not limited thereto.

Each of the slave devices 3200, 3300, 3400, 3500, 3600, 3700, 3800 and 3900 may be one of various circuits or devices which can passively operate based on a control of the master device 3100. For example, the slave devices 3200, 3300, 3400, 3500, 3600, 3700, 3800 and 3900 may include a radio frequency integrated circuit (RFIC) 3200, a power management integrated circuit (PMIC) 3300, a power supply module 3400, a secondary RFIC 3500, a sensor 3600, a fingerprint recognition chip 3700, a touch screen controller 1800, and a display driver integrated circuit or digital display interface (DDI) 3900.

The RFIC 3200 may include at least one connectivity chip. For example, the connectivity chip may include a chip 3210 for mobile (cellular) communication, a chip 3220 for wireless local area network (WLAN) (e.g., WiFi), a chip 3230 for Bluetooth communication, a chip 3240 for global navigation satellite system (GNSS) communication, a chip 3250 for processing frequency modulation (FM) audio/video, and a chip 3260 for near field communication (NFC), but example embodiments are not limited thereto.

The RFIC 3200 may further include at least one phase locked loop 3270. The phase locked loop 3270 may include the sub-sampling phase locked loop (SPLL) according to some example embodiments (e.g., the sub-sampling phase locked loop 100 of FIG. 1) and/or the sampling phase locked loop according to some example embodiments (e.g., the sampling phase locked loop 800 of FIG. 9). The phase locked loop 3270 may perform the sampling-based phase detecting operation. In addition, in the phase locked loop 3270, the loop filter 600 may be implemented in the dual-loop structure, the two transconductance circuits 300 and 400 separated from each other may drive the separate components (e.g., the resistor RLF and the capacitor CLF) in the loop filter 600, and the constant transconductance bias circuit 500 may include the switched capacitor resistor 520. Accordingly, the influence of the distributions of the resistors and the capacitors on the loop bandwidth may be canceled, and thus the phase locked loop 3270 may have the loop bandwidth in which the influence of the PVT variation is compensated (e.g., the loop bandwidth relatively insensitive to the PVT variation) and may have improved and/or enhanced performance. The phase locked loop 3270 may include SCR 520, GmP 302, and resistor RLF.

In some example embodiments, the phase locked loop 3270 may be formed to correspond to each connectivity chip.

The inventive concept may be applied to various electronic devices and systems that include the sub-sampling phase locked loops. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A sub-sampling phase locked loop (PLL) comprising:
a slope generating and sampling circuit configured to generate a sampling voltage based on a reference clock signal and an output clock signal;
a first transconductance circuit configured to generate a first output control voltage based on the sampling voltage, a reference voltage, and a control current;
a second transconductance circuit configured to generate a second output control voltage based on the sampling voltage, the reference voltage, and the control current;
a constant transconductance bias circuit including a switched capacitor resistor (SCR), the constant transconductance bias circuit configured to generate the control current;
a loop filter connected to an output terminal of the first transconductance circuit and an output terminal of the second transconductance circuit; and
a voltage controlled oscillator (VCO) configured to generate the output clock signal based on the first output control voltage and the second output control voltage,
wherein the constant transconductance bias circuit further includes
a first circuit connected between a power supply voltage and a ground voltage, and
a second circuit connected to the power supply voltage and the first circuit, and configured to output the control current, and
wherein the switched capacitor resistor is connected between the first circuit and the ground voltage and the switched capacitor resistor is configured to operate based on a first phase signal and a second phase signal.

2. The sub-sampling phase locked loop of claim 1, wherein the switched capacitor resistor includes:
a first switch connected between a first node and a second node, the first switch configured to be turned on and off based on the first phase signal, the first node being connected to the first circuit;
a first capacitor connected between the second node and the ground voltage; and
a second switch connected in parallel with the first capacitor between the second node and the ground voltage, the second switch configured to be turned on and off based on the second phase signal.

3. The sub-sampling phase locked loop of claim 2, wherein a current level of the control current generated by the constant transconductance bias circuit is proportional to a capacitance of the first capacitor.

4. The sub-sampling phase locked loop of claim 2, wherein an active duration of the first phase signal and an active duration of the second phase signal do not overlap.

5. The sub-sampling phase locked loop of claim 2, wherein
the first circuit includes:
a first transistor and a second transistor connected in series between the power supply voltage and the ground voltage; and
a third transistor and a fourth transistor connected in series between the power supply voltage and the first node, and
a gate electrode of the first transistor and a gate electrode of the third transistor are connected to each other, and
a gate electrode of the second transistor and a gate electrode of the fourth transistor are connected to each other.

6. The sub-sampling phase locked loop of claim 5, wherein
the second circuit includes a fifth transistor connected between the power supply voltage and a third node, the third node outputting the control current, and
a gate electrode of the fifth transistor is connected to the gate electrode of the first transistor and the gate electrode of the third transistor.

7. The sub-sampling phase locked loop of claim 2, wherein the loop filter includes:
a first resistor connected between the output terminal of the first transconductance circuit and the ground voltage; and
a second capacitor connected between the output terminal of the second transconductance circuit and the ground voltage.

8. The sub-sampling phase locked loop of claim 7, wherein a voltage level of the first output control voltage generated by the first transconductance circuit is proportional to a resistance of the first resistor, and is proportional to a capacitance of the first capacitor.

9. The sub-sampling phase locked loop of claim 1, wherein
a proportional path of the sub-sampling phase locked loop is formed by the first transconductance circuit, and
an integral path of the sub-sampling phase locked loop is formed by the second transconductance circuit.

10. The sub-sampling phase locked loop of claim 9, wherein a loop bandwidth of the sub-sampling phase locked loop is proportional to a gain of the proportional path.

11. The sub-sampling phase locked loop of claim 9, wherein
the first transconductance circuit includes a first input terminal, and a second input terminal, the first input terminal receiving the sampling voltage, the second input terminal receiving the reference voltage, and
the second transconductance circuit includes a third input terminal and a fourth input terminal, the third input terminal receiving the reference voltage, the fourth input terminal receiving the sampling voltage.

12. The sub-sampling phase locked loop of claim 9, wherein the first transconductance circuit and the second transconductance circuit have a same structure.

13. The sub-sampling phase locked loop of claim 9, wherein the first transconductance circuit and the second transconductance circuit have different structures.

14. The sub-sampling phase locked loop of claim 1, wherein the slope generating and sampling circuit includes:
a first circuit connected between a power supply voltage and a ground voltage, the first circuit configured to operate based on the output clock signal; and
a second circuit connected to the first circuit and the ground voltage, the second circuit configured to operate based on the reference clock signal and configured to output the sampling voltage.

15. The sub-sampling phase locked loop of claim 14, wherein
the first circuit includes: a first transistor, a first resistor, and a second transistor connected in series between the power supply voltage and the ground voltage, and
a gate electrode of the first transistor and a gate electrode of the second transistor are configured to receive the output clock signal.

16. The sub-sampling phase locked loop of claim 15, wherein the second circuit includes:
a first switch connected between the first resistor and a first node, the first switch configured to be turned on and off based on the reference clock signal;

a second switch connected between the first node and a second node, the second switch configured to be turned on and off based on an inverted reference clock signal, in the inverted reference clock signal the reference clock signal is inverted, the second node outputting the sampling voltage;

a first capacitor connected between the first node and the ground voltage; and a second capacitor connected between the second node and the ground voltage.

17. The sub-sampling phase locked loop of claim 16, wherein the second circuit is configured such that a slope of the sampling voltage is inversely proportional to a resistance of the first resistor, and the slope of the sampling voltage is inversely proportional to capacitances of the first and second capacitors.

18. An integrated circuit comprising:

a sub-sampling phase locked loop (PLL) configured to generate an output clock signal based on a reference clock signal; and an internal circuit configured to operate based on the output clock signal, wherein the sub-sampling phase locked loop includes a slope generating and sampling circuit configured to generate a sampling voltage based on the reference clock signal and the output clock signal, a first transconductance circuit configured to generate a first output control voltage based on the sampling voltage, a reference voltage, and a control current, a second transconductance circuit configured to generate a second output control voltage based on the sampling voltage, the reference voltage, and the control current, a constant transconductance bias circuit including a switched capacitor resistor (SCR), the constant transconductance bias circuit configured to generate the control current, a loop filter connected to an output terminal of the first transconductance circuit and an output terminal of the second transconductance circuit, and a voltage controlled oscillator (VCO) configured to generate the output clock signal based on the first output control voltage and the second output control voltage, wherein the constant transconductance bias circuit further includes, a first circuit connected between a power supply voltage and a ground voltage, and a second circuit connected to the power supply voltage and the first circuit, and configured to output the control current, and wherein the switched capacitor resistor is connected between the first circuit and the ground voltage and the switched capacitor resistor is configured to operate based on a first phase signal and a second phase signal.

19. A sub-sampling phase locked loop (PLL) comprising:

a slope generating and sampling circuit including a first resistor and a first capacitor, the slope generating and sampling circuit configured to generate a sampling voltage based on a reference clock signal and an output clock signal, a slope of the sampling voltage being inversely proportional to a resistance of the first resistor and a capacitance of the first capacitor;

a constant transconductance bias circuit including a switched capacitor resistor (SCR) including a second capacitor, the constant transconductance bias circuit configured to generate a control current, a current level of the control current being proportional to a capacitance of the second capacitor;

a first transconductance circuit configured to generate a first output control voltage based on the sampling voltage, a reference voltage, and a control current, a voltage level of the first output control voltage being proportional to a resistance of a second resistor and the capacitance of the second capacitor;

a second transconductance circuit configured to generate a second output control voltage based on the sampling voltage, the reference voltage, and the control current;

a loop filter including the second resistor, the loop filter connected to an output terminal of the first transconductance circuit and an output terminal of the second transconductance circuit; and a voltage controlled oscillator (VCO) configured to generate the output clock signal based on the first output control voltage and the second output control voltage, wherein a proportional path of the sub-sampling phase locked loop is formed by the first transconductance circuit, an integral path of the sub-sampling phase locked loop is formed by the second transconductance circuit, a loop bandwidth of the sub-sampling phase locked loop is independent of the resistance of the first resistor, the capacitance of the first capacitor, the resistance of the second resistor, and the capacitance of the second capacitor, and the loop bandwidth of the sub-sampling phase locked loop is proportional to a gain of the proportional path.

* * * * *